United States Patent [19]

Asai et al.

[11] 4,089,022

[45] May 9, 1978

[54] ELECTRON DEVICE

[75] Inventors: Shojiro Asai, Kanagawa; Toshiaki Masuhara, Hachioji; Kenji Kaneko, Kokubunji, all of Japan

[73] Assignee: Hitachi, Ltd., Japan

[21] Appl. No.: 744,864

[22] Filed: Nov. 24, 1976

[30] Foreign Application Priority Data

Dec. 5, 1975 Japan .................................. 50-143995

[51] Int. Cl.² ........................................... H01L 29/78
[52] U.S. Cl. .......................................... 357/23; 357/4; 357/34; 357/41; 357/59
[58] Field of Search ...................... 357/4, 23, 41, 34, 59

[56] References Cited

U.S. PATENT DOCUMENTS

| 3,967,295 | 6/1976 | Stewart | 357/23 |
| 3,974,515 | 8/1976 | Ipri et al. | 357/23 |

Primary Examiner—Edward J. Wojciechowicz
Attorney, Agent, or Firm—Craig & Antonelli

[57] ABSTRACT

An electron device comprising (i) a semiconductor element which includes a semiconductor region A of a first conductivity type, a semiconductor region B of a second conductivity type adjoining the region A, and a semiconductor region C of the second conductivity type adjoining the region A and isolated from the region B by the region A, and in which on a surface extending from the region B via the region A to the region C, a gate electrode is provided through an insulating film, (ii) means for holding a potential of the gate electrode so that a potential of minority carriers in a surface portion of the region A underneath the gate electrode may become lower than a potential in an inner portion of the region A, (iii) means for applying a forward bias voltage between the region A and the region B, and (iv) means for applying to the region C a potential by which a potential for the minority carriers becomes lower in the region C than in the region B. The electron device is capable of such operations as amplification, oscillation and memory under an extraordinarily low supply voltage, and is extraordinarily low in the power consumption.

16 Claims, 39 Drawing Figures

ELECTRON DEVICE

BACKGROUND OF THE INVENTION

(i) Field of the Invention

This invention relates to an electron device which can conduct amplification, oscillation and other operations with a semiconductor element and under an extraordinarily low supply voltage and power consumption. More particularly, it relates to an electron device or semiconductor circuit which can conduct amplification, oscillation and other operations by the use of semiconductor elements permitting a high density of integration and under an extraordinarily low supply voltage and power consumption.

(ii) Brief Description of the Prior Art

As integrated circuits operating at low power, there have hitherto been known the so-called complementary MOS (CMOS) circuit in which insulated gate field-effect transistors of the two types of n-channel and p-channel types are integrated, and an integrated injection logic (IIL) circuit which is a bipolar integrated circuit. Although both the circuits have excellent features, they are subject to limitations. For example, in case of the CMOS circuit, the manufacturing process is complicated, and it is difficult to raise the packaging density. In case of the IIL circuit, since it is a bipolar semiconductor device, an operation under a supply voltage lower than about 0.7 V is essentially difficult.

SUMMARY OF THE INVENTION

This invention has for its object to eliminate the difficulties of the prior art and to provide an electron device or semiconductor circuit which can conduct amplification, oscillation, memory, logic and other operations by the use of semiconductor elements permitting a high density of integration and under an extraordinarily low supply voltage as well as an extraordinarily low power consumption.

In order to accomplish the object, the electron device or semiconductor circuit according to this invention comprises (i) a semiconductor element which includes a semiconductor region A of a first conductivity type, a semiconductor region B of a second conductivity type adjoining the region A, and a semiconductor region C of the second conductivity type adjoining the region A and isolated from the region B by the region A, and in which on a surface extending from the region B via the region A to the region C, a gate electrode is provided through an insulating film, (ii) means for applying a forward bias voltage between the region A and the region B, (iii) means for applying to the region C a potential by which a potential for minority carriers existing in the region A becomes lower in the region C than in the region B, and (iv) means for holding a potential of the gate electrode so that a surface portion of the region A underneath the gate electrode may become a weak-inversion region (a region in which a current between the region B and the region C as flows owing to the construction including the element and the means depends exponentially on a potential difference between the gate electrode and the region B).

The body part of the semiconductor element is usually made of silicon, but it is not restrictive.

The region A of the semiconductor element to be employed in the electron device can be constructed of a semiconductor substrate of the first conductivity type. In this case, the regions B and C are formed in surface portions of the semiconductor substrate on one side thereof. In case where the semiconductor substrate to be used is of the second conductivity type, the region A is made up of a region of the first conductivity type which is formed into the shape of a well from the surface of the substrate on one side thereof, and the regions B and C of the second conductivity type are provided in inside surface portions of the well-shaped region A or in peripheral surface portions of the region A (i.e., portions each of which stretches over a surface portion of the region A and a surface portion of the second conductivity type substrate). In this case, in order to establish connection with the region A, generally a high concentration region of the first conductivity type is provided in an inside surface portion or a peripheral surface portion of the well-shaped region A.

An appropriate value of the voltage to be applied to the gate electrode differs depending on the impurity concentration of the region A and the kind and thickness of the insulating film underlying the gate electrode. In case where the value is substantially equal to the potential of the region B, the gate electrode and the region B may be directly coupled. Likewise, in case where the value of the voltage of the gate electrode is substantially equal to the potential of the region A, the region C or a supply voltage, the gate electrode may be directly coupled with the region A, the region C or a power supply terminal.

Of course, a plurality of such semiconductor elements (i) can be integrated.

An appropriate value of the forward bias voltage to be applied between the region A and the region B differs depending on the semiconductor material which constitutes the body part of the semiconductor element. In case where the semiconductor material is silicon, it is desirable that the forward bias voltage is 0.6 V or below. When the bias voltage is made higher than 0.6 V, the injection of the minority carriers arises at the entire area of the region A as adjoins the region B, and substantially the same characteristics as in a conventional bipolar transistor are exhibited. The forward bias voltage can be derived from a power supply and/or an input signal.

Although the gate electrode may be made of a metallic material, it may be made of polycrystalline silicon as is well known in MOS transistors.

In case where a plurality of well-shaped regions A are formed in an identical silicon substrate of the second conductivity type, a high concentration region of the second conductivity type can be provided in a surface portion of the silicon substrate between the well-shaped regions A in order to prevent conduction based on a surface channel between the regions A. Further, in order to prevent inversion in the surface of the well-shaped region, a high concentration region of the first conductivity type may be provided in a surface portion of the silicon substrate around the well-shaped region.

In order to shorten the effective carrier diffusion time in the region A, a region of the first conductivity type may well be formed in contact with the region B and on the side of the region C under the state under which it is isolated from the region C. The impurity concentration of the first conductivity type region to be formed in this case is made higher than that of the region A.

The semiconductor regions A, B and C stated above can also be formed on a sapphire substrate. This measure enables one to achieve sharp reduction of parasitic capacitances and enhancement of the operating speed.

In case of employing, for example, silicon as the material of the semiconductor element, the electron device according to this invention constructed as described above comes to operate even when the supply voltage having hitherto been required to be at least about 0.7 V is as slight as 0.25 V. Accordingly, only a slight power is dissipated. Moreover, a high density of integration is structurally possible.

BRIEF DESCRIPTION OF THE DRAWINGS

FIG. 37b is a diagram showing the input — output transfer characteristic of the embodiment shown in FIG. 37a.

DETAILED DESCRIPTION OF THE INVENTION

The feature of the operating principle of the electron device according to this invention consists in exploiting a carrier injection phenomenon which is remarkably intensified by the field effect in a semiconductor element. The carrier injection phenomenon has recently been found out by the inventors of this invention, and it will be explained first.

Figure 1:
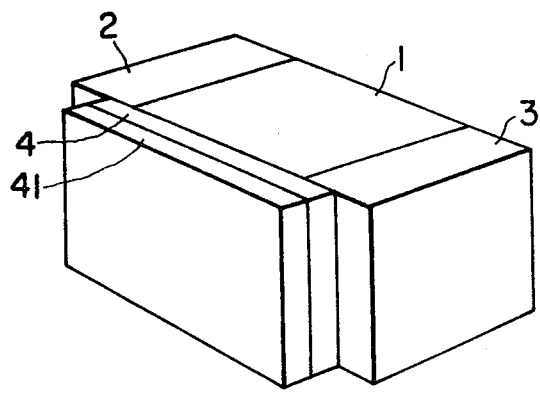
FIG. 1 is a perspective view of a semiconductor element for explaining the operating principle of the semiconductor element which is one constituent of the electron device according to this invention.
Figure 2:
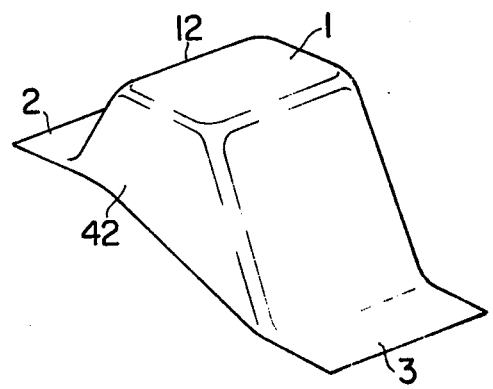
FIGS. 2 and 3 are bird's-eye views each showing a potential of minority carriers within the semiconductor element.

FIG. 1 shows a semiconductor element structure in which the phenomenon is noted. The structure comprises a semiconductor region 1 of a first conductivity type, semiconductor regions 2 and 3 of a second conductivity type which adjoin the semiconductor region 1, and a gate electrode 41 which serves to control a surface potential and which is provided on a surface of the region 1 in a manner to extend from the region 2 to the region 3 and through an insulating film 4. The structure can also be regarded as an insulated gate field-effect transistor in which the region 1 is a substrate, the region 2 is a source and a region 3 is a drain and which has the insulating film 4 and the gate electrode 41. When the structure is used as the insulated gate field-effect transistor, an appropriate voltage is applied between the gate and the source under the state under which the substrate 1 is directly coupled with the source 2 or is reverse-biased. Thus, a potential for minority carriers of the substrate 1 in a surface region of the substrate is made sufficiently low, thereby to bring the surface region into the so-called inversion state in which the number of the minority carriers exceeds that of majority carriers. In this way, the source region 2 and the drain region 3 are put into the conductive state. Simultaneously therewith, the conductivity is modulated by a signal voltage which is applied between the gate and the source. Now, under the state under which an appropriate voltage is applied between the source and the drain so as to permit a current to flow therebetween, the potential distribution of the minority carriers of the region 1 is taken as a bird's-eye view in the semiconductor element of the structure of FIG. 1. Then, the view of FIG. 2 is obtained. In the surface 42 of the substrate 1, the minority carrier potential is conspicuously low, and an inversion layer or the so-called channel is formed. Accordingly, the carriers which are majority carriers in the regions 2 and 3 but are the minority carriers in the region 1 can travel between the emitter (source) and the collector (drain) without any obstruction. This is the operating principle of the insulated gate field-effect transistor. Now, the gate potential is made such extent that although it is not so low as sufficiently inverts the surface of the region 1, it is enough to bring the surface of the region 1 near to the intrinsic condition, i.e., enough to make the minority carrier potential lower in the surface of the region 1 than in an inner portion thereof. Further, an appropriate potential difference is given between the regions 2 and 3. When, under such state, the distribution of the minority carrier potential of the region 1 is viewed in the semiconductor element of the structure of FIG. 1, it is as in FIG. 3.

Figure 3:
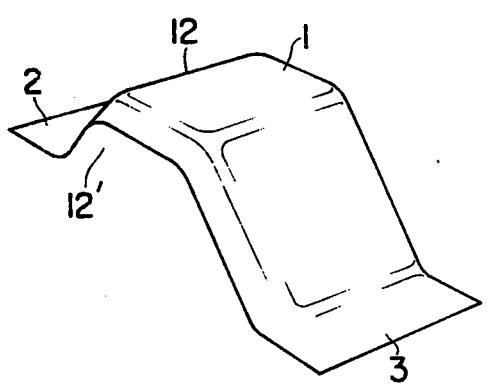

The injection phenomenon intensified by the field effect as exploited in this invention is observed when, under the above state, a forward bias is applied between the regions 1 and 2 having the opposite conductivity types. More specifically, the majority carriers of the region 2, i.e., the minority carriers of the region 1 are injected from the region 2 to the region 1 by the forward bias. The injection takes place along the surface highly efficiently because a potential barrier 12' in the surface as shown in FIG. 3 is low in comparison with a barrier 12 in the inner portion, in other words, the surface is closer to the intrinsic semiconductor than the inner portion. The injected minority carriers diffuse as they are restrained to the vicinity of the surface of the region 1. Since the vicinity of the surface is close to the intrinsic condition, the minority carriers have comparatively few chances of recombination. Accordingly, they get to the region 3 efficiently.

Figure 4:
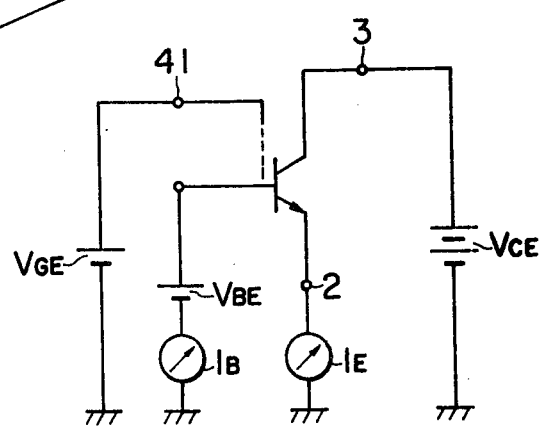
FIG. 4 is a circuit diagram showing the operating principle of this invention.

FIG. 4 shows a circuit which is used when the injection phenomenon is actually measured quantitatively. In the figure, the element of the structure of FIG. 1 is represented by symbols which have been determined for convenience' sake by revising symbols of a bipolar transistor. That is, the region 1 in FIG. 1 is regarded as a base, the region 2 as an emitter (the emitter which is made the n-type and for which an outward arrow is depicted is shown in FIG. 4), and the region 3 as a collector, and the symbol of the gate 41 is added to the symbols of the bipolar transistor made up of the above regions. Terminals Nos. in FIG. 4 correspond to Nos. of the structural parts in FIG. 1. The revised symbols of the bipolar transistor are employed in order to emphasize that the minority carrier injection is concerned with the operation.

Figure 5:
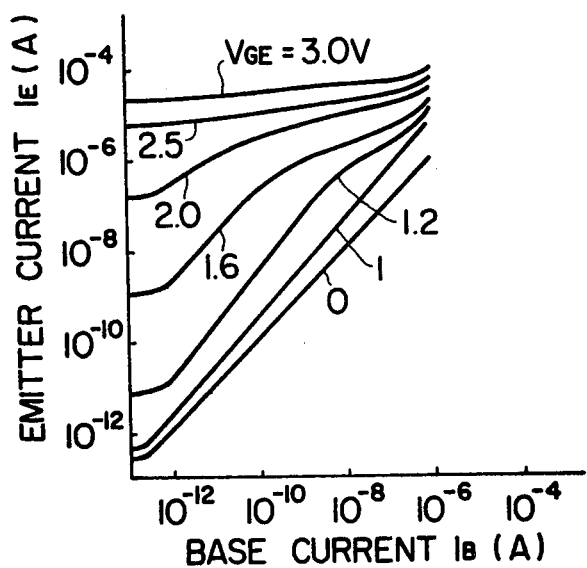
FIGS. 5 and 8 are diagrams each showing examples of operating characteristics of the electron device of this invention.

FIG. 5 shows an example of a characteristic of the semiconductor element having the n-type emitter, the p-type base, the n-type collector and the gate electrode as was actually measured with the circuit of FIG. 4. The element was about 6.5 μm in the distance between the emitter and the collector, and about 20 μm in the widths of the emitter and the collector. As seen in FIG. 5, in the element, when there is no potential difference between the gate and the emitter, that is, when $V_{GE} = 0$, the emitter current $I_E$ is substantially equal to the base current $I_B$, in other words, no current amplification is effected. However, as the gate — emitter voltage $V_{GE}$ increases, the emitter current $I_E$ which is many times as great as the base current $I_B$ flows to effect the current amplification. For example, in case of $V_{GE} = 1.6$ V, the current amplification factor $\beta = I_E/I_B$ reaches 1,000 to 2,000 as viewed in a region in which the currents $I_E$ and $I_B$ are substantially proportional, i.e., in a range in which $10^{-12}$ A $< I_B < 10^{-9}$ A. Referring to the base — emitter voltage at this time, when $V_{GE} = 1.6$ V, $I_B = 10^{-8}$ A corresponds substantially to $V_{BE} = 0.6$ V. Therefore, the extraordinarily high current gain is obtained under the extraordinarily low forward voltage. In case where the gate voltage is further increased to $V_{GE} = 2.0$ V or higher, the emitter current is controlled practically only by the gate voltage $V_{GE}$ and does not intensely depend on the base current as seen in FIG. 5. This is because the conduction by the surface inversion layer channel becomes conspicuous as already stated, and the element ought to be regarded as conducting the operation of the insulated gate field-effect transistor.

In this manner, in the example of FIG. 5, the current amplification factor which is extraordinarily great is attained at gate — emitter voltages $V_{GE}$ between about 1 V and 2 V and in a region of comparatively low base voltages and base currents. This is based on the minority carrier injection phenomenon intensified by the field effect as has already been explained with reference to FIG. 3. By the way, drain currents were measured by operating as the insulated gate field-effect transistor the element with which the result of FIG. 5 was obtained and by directly coupling the region 1 (substrate) to the region 2 (source) in FIG. 1. The square root values of the drain currents were plotted versus gate — source voltages, and a linear extrapolation was made. The so-called threshold voltage $V_T$ thus defined as the gate — source voltage corresponding to the zero drain current was about 2 V. The experimental result of FIG. 5 is further understood in conjunction with the explanation given above.

Figure 6:
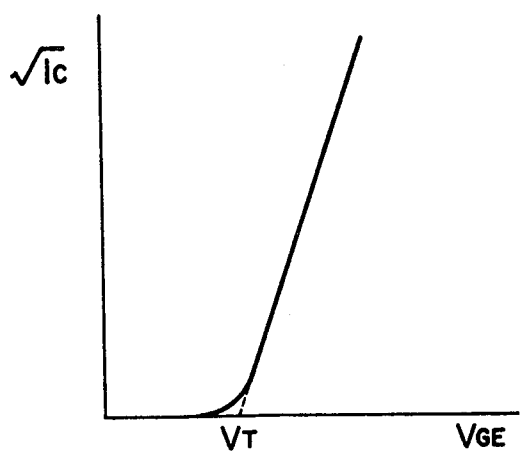
FIGS. 6 and 7 are diagrams showing the relations between the voltage of a gate electrode and the current flowing between regions B and C.
Figure 7:
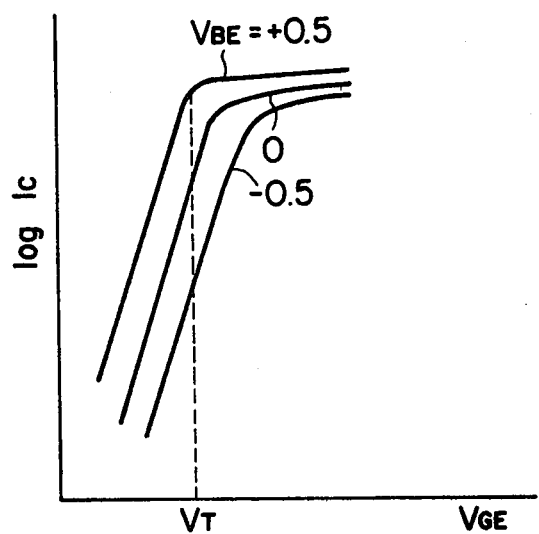

In general, the relationship between the drain — source current $I_C$ and the gate — source voltage $V_{GE}$ of the insulated gate field-effect transistor becomes as shown in FIGS. 6 and 7. FIG. 6 shows the relation between the square root of $I_C$ (on the axis of ordinates) and $V_{GE}$ (on the axis of abscissas). The characteristic consists of a rectilinear part and a curved part of low $\sqrt{I_C}$. A point at which the extension of the rectilinear part intersects with the axis of abscissas is $V_T$. FIG. 7 shows plots of the relation between log $I_C$ taken on the axis of ordinates and $V_{GE}$ taken on the axis of abscissas. In FIG. 7, a part corresponding to the curved part in FIG. 6 is a rectilinear part. $V_T$ in FIG. 7 corresponds to a point at which the rectilinear part comes near to a point of bend. In the case of FIG. 7, the bias voltage $V_{BE}$ between the regions A and B is set at +0.5 V, 0 V and −0.5 V. The gate — source voltages $V_{GE}$ which are effective in the electron device of this invention, that is, with which the current amplification factor becomes great are in a range corresponding to the rectilinear part in FIG. 7. In other words, the voltages $V_{GE}$ with which a current flowing between the regions B and C depends exponentially on the potential difference between the gate electrode and the region B are desirable gate electrode potentials. When the voltage $V_{GE}$ lies within the range, the surface portion of the region A underneath the gate electrode becomes the weak-inversion region.

Figure 8:
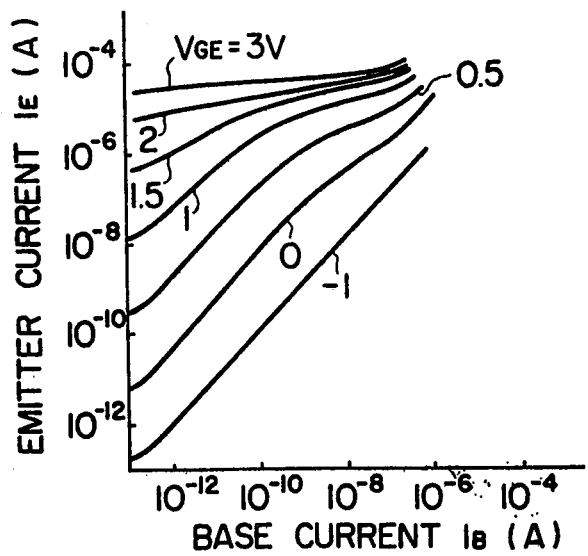

On an element whose dimensions were the same as in the case of FIG. 5 and whose threshold voltage $V_T$ was about 1 V, the measurement in FIG. 4 was carried out. The resultant characteristic corresponding to FIG. 5 is illustrated in FIG. 8. As apparent from FIG. 8, in the element of low $V_T$, the intensified injection owing to the field effect takes place at low $V_{GE}$.

As understood from the foregoing, the transistor operation which exploits the intensified injection owing to the field effect is characterized in that the injection from the emitter into the base region whose surface is brought into the depletion or the weak-inversion state by the field effect is caused by the voltage which is lower than 0.7 V (in case of silicon) being the ordinary diode current rise voltage. It is essentially different from the usual bipolar transistor operation in which the injection takes place towards substantially the entire region of the base region. The face that the operation of the intensified injection is done in the low voltage and low current range, supports the feature of the low power consumption of the integrated circuit according to this invention. To be added is that the semiconductor circuit of this invention is quite different from a tetrode semiconductor element with a surface potential control electrode which C. T. Sah has proposed in a paper contained in 'Proceedings of IRE,' Vol. 49, page 1623 published in 1961. Firstly, in the element proposed by Sah, the gate electrode covers only a part on the emitter side, of a base region surface from the emitter to the collector. Therefore, even if the minority carrier injection along the surface occurs from the emitter, it is difficult to diffuse the minority carriers up to the collector without recombining them. Secondly, the metal electrode is taken out from the base surface. Therefore, the minority carriers recombine in this region, and they are difficult to get to the collector. In fact, the remarkable current amplification factor as described above has not been found out in the Sah's element.

Thus far, there has been elucidated the fundamental operation of the semiconductor circuit wherein the surface potential of the minority carriers of the base is lowered by the gate electrode, the base — emitter circuit is forward-biased, the highly efficient injection of the minority carriers is caused along the base surface, and they are collected to the collector.

For the semiconductor circuit of this invention, it is inconvenient that, before the forward bias is applied between the base of the first conductivity type and the emitter of the second conductivity type, the emitter and the collector are already conducted electrically. Of course, the value of a current at the conduction is of the nature that it can be controlled by the potential of the gate. However, it incurs drawbacks in the applications of the circuit that, even when no potential difference exists between the gate and the emitter and between the base and the emitter, the collector — emitter circuit is conductive. In order to make the emitter — collector current at the base — emitter short-circuit lower than $10^{-11}$ A or so, accordingly, the base concentration and the thickness of the insulating film need be selected so that when the base is rendered forward as viewed from the emitter, the same potential difference may have to be bestowed on the gate. This is equivalent to say that when the device of the object of consideration is regarded as the insulated gate field-effect transistor by calling the base the substrate anew, the emitter the souce and the collector the drain, the gate threshold voltage $V_T$ at the substrate — source short-circuit has the same sign as that of the substrate — source forward bias, in other words, the transistor is of the enhancement type. Hereinbelow, the expression "threshold voltage" or "$V_T$" shall be defined as the gate — source voltage at the time when the unitary semiconductor circuit of this invention is regarded as the insulated gate field-effect transistor as set forth above, said gate — source voltage being required for some extent of current to begin to flow between the drain of the second conductivity type and the source of the second conductivity type under the state under which the substrate of the first conductivity type is short-circuited to the source (more in detail, the gate — source voltage corresponding to the zero current which is obtained by the extrapolation on the assumption that the square root of the current flowing between the drain and the source is proportional to the gate — source voltage).

Hereunder, this invention will be described more in detail in connection with the embodiments thereof.

DESCRIPTION OF THE PRESENTLY PREFERRED EMBODIMENTS

EXAMPLE 1

Figure 9:
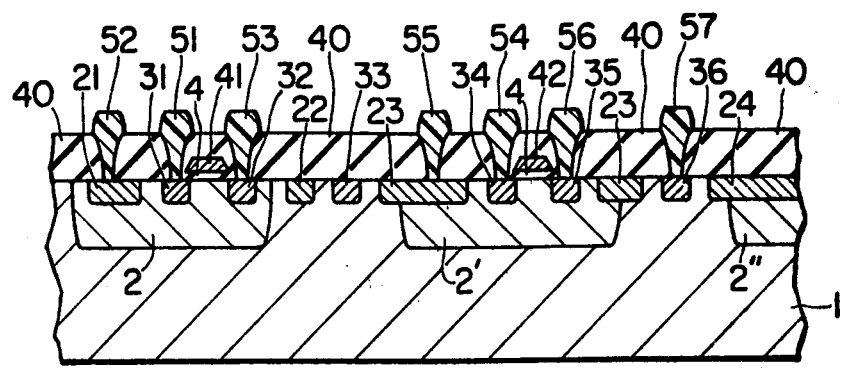
FIGS. 9, 18, 19, 21, 22, 25, 28 and 34 are sectional views each showing a semiconductor element or semiconductor elements in an embodiment of this invention.

FIG. 9 is a structural sectional view for explaining the first embodiment of this invention. The manufacturing process of an integrated circuit of this embodiment will be briefly set forth. First of all, in an n-type silicon substrate 1 having a specific resistance of 2 Ωcm, well-shaped p-type regions 2, 2' and 2" are formed to a depth of about 6 μm by the ion implantation of B+ and the succeeding heat treatment. Subsequently, high concentration p-type regions (hereinafter, shortly termed "p+ regions") 21, 22, 23 and 24 are diffused along the peripheries of the p-type wells. Subsequently, an oxide film 4 having a thickness of 1,000 A is grown, and polycrystalline silicon regions 41, 42, etc. are provided thereon. Using the polycrystalline silicon as a mask, a phosphorus ion implantation is carried out to form high concentration n-type regions (hereinafter, shortly termed "n+ regions") 31, 32, 33, 34, 35, 36, . . . . within the p-type wells and in regions contacting with the n-type substrate. Metal electrodes 51, 52, 53, 54, 56, 57, . . . . are provided at necessary places. Thus, the integrated circuit is completed. In the above process, thick oxide films 40 containing phosphorus are formed at several parts. In FIG. 9, the n+ region (for example, that 33) serves to prevent the conduction ascribable to a surface channel between the p-type wells (2 and 2'). The provision of the p+ region (for example, 22) around the p-type well is for preventing the surface of the p-type well from being inverted to the n-type. In the present embodiment, there are integrated a large number of unitary semiconductor circuits of this invention as are lateral n-p-n transistors provided with surface potential control electrodes, for example, a lateral n-p-n transistor having an emitter 31, a collector 32 and a base 2 and provided with a surface potential control electrode 41. It is also possible to operate the electron device by applying an input signal to the surface potential control electrode 41.

Figure 10:
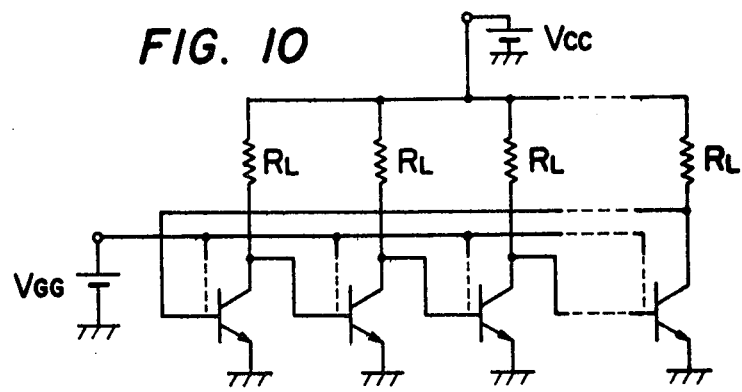
FIGS. 10, 12, 13, 15, 16, 23, 26, 29, 31, 35, 36, 37a and 38 are circuit diagrams in the embodiments of this invention.

At a part of the integrated circuit shown in FIG. 9, there is assembled a ring oscillator which is composed of resistance load inverters connected as shown in FIG. 10. Employed for load resistances $R_L$ in FIG. 10 are resistances of polycrystalline silicon layers or p-type diffused resistances. The substrate 1 is held at a supply voltage $V_{CC}$ through the n+ region 36 in FIG. 9. Besides the supply voltage $V_{CC}$, a gate supply voltage $V_{GG}$ is applied. Then, when an input signal being positive with respect to a grounded emitter enters a base in each inverter stage in FIG. 10, a collector output becomes the zero level, and when a signal of the zero level enters the base, the collector output becomes a positive level. Therefore, the oscillation can be caused in such a way that the output of a connection consisting of an odd number of inverters is fed back to the input of the first stage. At this time, a voltage being positive with respect to the emitter is applied to a gate so that the potential of electrons which are minority carriers of the base may become lower in the surface of the base than in the inner portion thereof. It is apparent from the above description that the present circuit is one of concrete examples of this invention.

The waveform of the above oscillation was measured by the use of a probe and an oscilloscope, the delay time $t_{pd}$ per stage of the inverter in FIG. 10 was evaluated from the frequency of the oscillation, and the power dissipation $p_d$ per stage was evaluated from the supply voltage $V_{CC}$ and the load resistance $R_L$. As the result, $p_d = 3 \times 10^{-8}$ W and $t_{pd} = 0.7$ μs were obtained, and the power dissipation — delay time product $t_{pd}p_d$ became a value of 0.02 pJ. Regarding the operating voltage, a logic operation was confirmed down to the lowest supply voltage $V_{CC}$ of 0.25 V. This is a low value which has never been obtained as to the supply voltages of the prior-art integrated circuits, and is based on the fact that the semiconductor circuit of this invention exploiting the injection of the minority carriers along the surface as remarkably intensified by the field effect operates essentially under a low voltage and accordingly under a low power.

In order to use the device of the present embodiment under the optimum state, for example, at the minimum power dissipation — delay time product, the gate supply voltage $V_{GG}$ need be selected. It is as already stated that the optimum gate supply voltage value $V_{GG}{}^{OPT}$ is related to the threshold value voltage $V_T$ for forming the surface channel. Experimentally, in case of a device having $V_T = 1.3$ V, $V_{GG}{}^{OPT}$ became 1.0 V, and in case of an element having $V_T = 0.3$ V, $V_{GG}{}^{OPT}$ became 0 (zero) V. In the latter case, an operation at $V_{CC} = 0.25$ V was the optimum. Therefore, in adopting an expression in which the circuit of the present embodiment is regarded as an insulated gate field-effect transistor, it can be said that the circuit was operated by inputting signals so as to forward-bias the substrate up to about 0.25 V under the state under which the gate voltage was lower by about 0.3 V than the threshold value. Here, the term "substrate" signifies the p-type well.

The present example indicates that the semiconductor circuit of this invention operates under the conspicuously low supply voltage and power consumption which have not hitherto been attained. In the above circuit regulated to $V_T = 0.3$ V, the optimum gate — emitter bias voltage is 0 (zero) V. Therefore, by connecting the gate electrode to the emitter electrode on the circuit in advance, interconnections on the chip can be made very simple.

EXAMPLE 2

Figure 11:
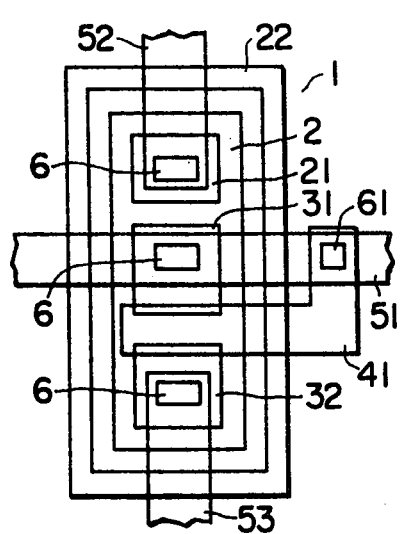
FIGS. 11, 14, 20, 24, 27, 30, 32 and 33 are plan views of the semiconductor elements in the embodiments of this invention.

FIG. 11 is a plan view showing a part of the second embodiment of this invention in which the above idea is materialized. The outline of the manufacturing process of the present embodiment is as stated in the first embodiment. A difference is that, in order to make the threshold voltage $V_T$ 0.3 V, a very slight P+ ion implantation is carried out only in the surface of the active element in addition to the B+ ion implantation which determines the impurity concentration of the p-type well. More specifically, in FIG. 11, a p-type well 2, p+ regions 21 and 22, n+ regions 31 and 32 and a polycrystalline silicon gate electrode 41 are provided in an n-type substrate 1. The emitter 31, the collector 32, and the base 2 or a high concentration region 22 thereof are connected to metallic wirings 51, 53, and 52 through contact windows 6, respectively. The gate electrode 41 is directly coupled with an emitter wiring 51 through a contact window 61. The p+-type region 22 is called a channel stopper or guard band, and is a contrivance for preventing the p-inversion of the surface of the substrate 1.

Figure 12:
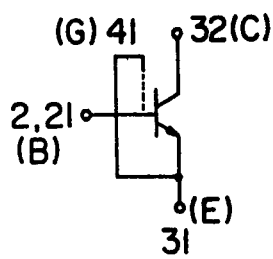

Also in the present embodiment, the switching speed and the power dissipation were assessed with a circuit similar to that of FIG. 10, and substantially equal performances to those of the first embodiment could be obtained. Since, in the present embodiment, the power supply wirings for the gates could be omitted on the chip, the layout of the circuit was simplified, and the number of elements per unit area could be increased by 20% over that in the case of the first embodiment. FIG. 12 symbolically represents the unitary circuit of the present embodiment, and reference numerals in the figure correspond to those in FIG. 11.

EXAMPLE 3

Figure 13:
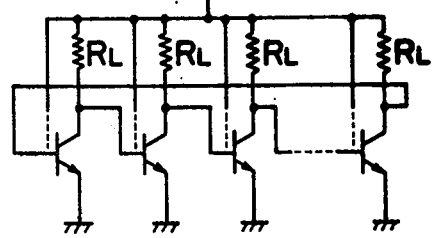

FIG. 13 is a circuit diagram for explaining the third embodiment of this invention. The sectional structural view of the present embodiment is the same as in FIG. 9. The impurity concentration of the p-type well was adjusted so that $V_T$ might become about 1.0 V. In the present embodiment, as seen in FIG. 13, the gate electrodes were directly coupled with the power supply wiring on the chip so as to keep the gate voltage equal to the main supply voltage. Since, in the present embodiment, the substrate itself (referring to FIG. 9, the substrate 1) is at the power supply potential, the interconnection of the wiring can be made merely by bringing a gate electrode lead into contact with the substrate at a position at which the lead has just come out of the p-type well, and this serves to increase the packaging density as in the second embodiment. The ring oscillator in FIG. 13 operated over supply voltages $V_{CC}$ of from 0.3 V to 1.5 V or so, and a value of 0.03 pJ was obtained in the power dissipation — delay time product.

EXAMPLE 4

Figure 14:
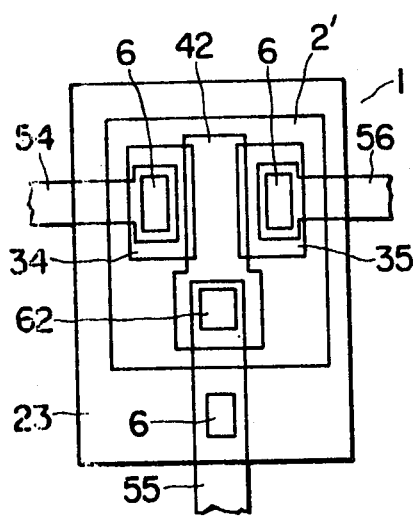
Figure 15:
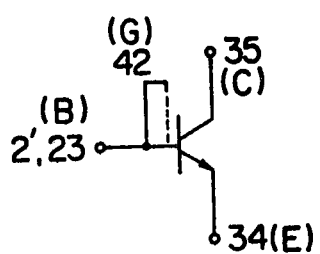
Figure 16:
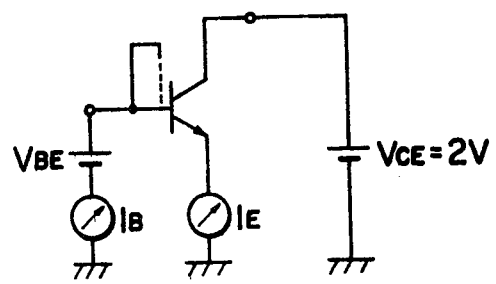
Figure 17:
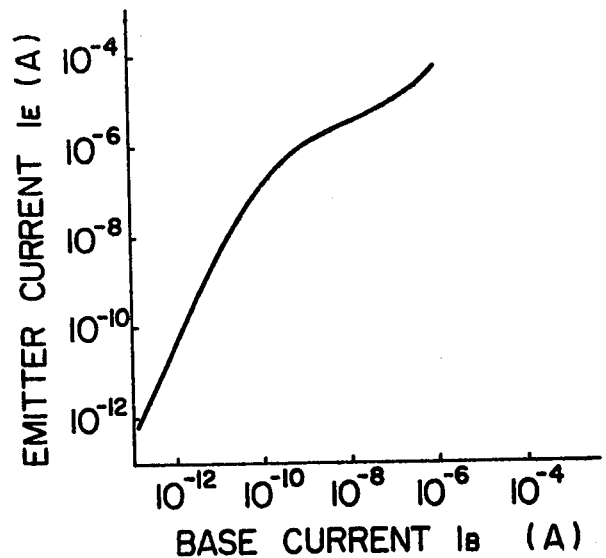
FIG. 17 is a diagram of the operating characteristic of the embodiment shown in FIG. 14.

The fourth embodiment of this invention will be described in connection with FIG. 14. Also the present embodiment can have the sectional structure explained by the use of FIG. 9, and the structure will be set forth along FIG. 14 with reference to FIG. 9. The circuit of the present embodiment comprising a p-type well base 2' and a p+ region 23 contacting with the base 2' and surrounding it as are provided within an n-type substrate 1, an emitter 34 and a collector 35 which are n+ regions provided within the p-type well 2', a polycrystalline silicon gate electrode 42 which covers through an insulating film a base surface extending from the emitter to the collector, and electrode wirings 54, 55 and 56 of the emitter, the base and a gate and contact windows 6 therefor, is characterized in that the base wiring metal 55 is directly coupled with the gate electrode 42 through a contact window 62. The circuit is symbolically expressed as in FIG. 15. In FIG. 15, Nos. of terminals correspond to those in FIG. 14, and hence, no further detailed explanation will be required. The characteristic of the unitary circuit of the present embodiment was measured with a circuit shown in FIG. 16, and the result of the measurement is as illustrated in FIG. 17. It is understood that current amplification factors of 50 or more are obtained for base currents $I_B$ of $10^{-12}$ A or greater. In the present circuit, it is a characterizing feature that an input signal to the base for forward-biasing the emitter is simultaneously applied to the gate. The input signal functions to inject the minority carriers from the emitter into the base, and also restrains the carriers to the base surface. Accordingly, in case where the base input current is low, in other words, where the base - emitter voltage is low, the minority carrier potential of the base surface is held comparatively high. It is accordingly possible that the current which flows between the collector and the emitter under the "off" state of the circuit of this invention is suppressed to a very low level. In an inverter which was composed of the unitary semiconductor circuits of the present embodiment, a value of the power dissipation per stage $p_d$ of $2 \times 10^{-8}$ W and a value of the delay time $t_{pd}$ of 0.2 μs were obtained. The circuit of the present embodiment has the sharper current cut-off characteristic as described above, and besides, it does not require any independent gate electrode wiring as seen in FIG. 14, so that it can raise the packaging density.

It not only reduces the wiring area and enhances the packaging density but also brings the circuit characteristics the characterizing effects that, as indicated in the second, third and fourth embodiments, the gate electrodes are directly coupled with the emitters, the bases, the power supply terminals or the collectors on the chip.

EXAMPLE 5

The fifth embodiment of this invention will be described with reference to a sectional view of FIG. 18. The present embodiment is constructed of fundamental circuits each comprising a p-type well 2 having a depth of 6 μm and a surface acceptor concentration of $1 \times 10^{16}$ cm$^{-3}$ as is formed in a substrate of the first conductivity type, for example, an n-type silicon substrate 1 having a specific resistance of 5 Ωcm, comparatively high concentration p-type regions 21 and 22, high concentration n-type regions 31 and 32, a gate electrode 41 which is provided on a surface through an oxide film 4 being 1,000 A thick, a thick insulating film 40, and metal electrodes 51, 52 and 53. Here, the comparatively high concentration p-type region 21 is formed by diffusion through the same diffusion window as the right half of the n-type region 31. When viewed as an insulated gate field-effect transistor, the element structure thus manufactured is a structure called the diffusion-self-aligned MOS transistor or the double-diffused MOS transistor which has been published by Tarui et al. in a paper contained in 'Journal of Japan Society of Applied Physics,' Supplement to Vol. 40, page 193. Also in case of use in the circuit of this invention, such structure has an effect in shortening the effective diffusion time of the carriers through the base region. The reasons will be explained. When, in FIG. 18, the region 31 is let to be the emitter and the region 32 the collector, the base regions held between the two regions 31 and 32 consist of the comparatively high concentration p-type region 21 and the comparatively low concentration p-type region 2. Therefore, the minority carrier potential can be comparatively easily lowered in the surface of the region 2 by the gate electric field. When the minority carrier potential of the surface of the region 21 is lowered by the gate voltage to an amount sufficient for the circuit operation of this invention, the inversion state already appears in the surface of the region 2, and the inversion layer effectively acts as if it were the collector. Besides, the width of the region 21 can be realized so as to lie in a sufficiently small range of about 1 μm by the double diffusion of an acceptor impurity and a donor impurity. It is also possible to operate the element by applying an input signal to the gate electrode 41.

Figure 18:
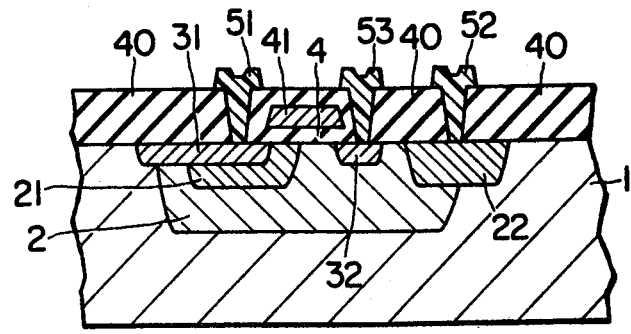

In the present example, the ring oscillator made up of eleven stages of inverters as shown in FIG. 10 was constructed by employing the unitary circuits of this invention as shown in FIG. 18. In the example, 2.5 V was required as the gate supply voltage $V_{GG}$, and 0.4 V as the main supply voltage $V_{CC}$. The delay time was $6 \times 10^{-8} s$ and the power dissipation was $1 \times 10^{-7} W$ per stage of inverter. Accordingly, a value of $6 \times 10^{-15} J$ was obtained as the power dissipation — delay time product.

EXAMPLE 6

Figure 19:
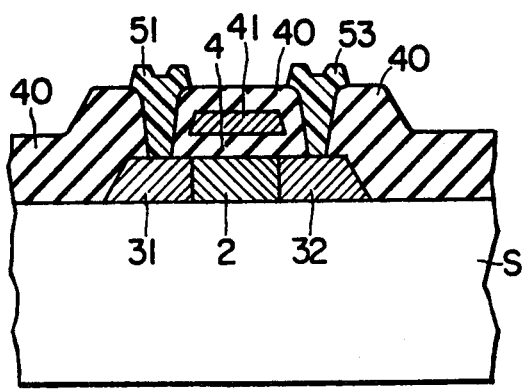
Figure 20:
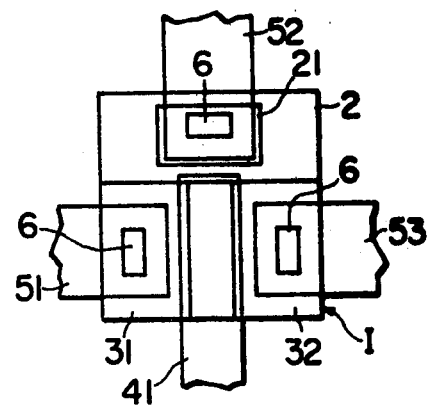

The sixth embodiment of this invention will be described with reference to FIGS. 19 and 20. FIG. 19 shows a part of the sectional structure of the present embodiment. It will be explained in the sequence of manufacture. Employed as a starting material is the so-called silicon on sapphire (SOS) in which a p-type epitaxial silicon layer 2 having a carrier concentration of $1 \times 10^{16}$ cm$^{-3}$ is grown on a sapphire substrate. A high concentration p-type diffusion is done into a region 21 seen in a plan view of FIG. 20, whereupon silicon is removed so as to leave an island region I behind. A polycrystalline silicon gate electrode 41 is provided on a surface silicon oxide film 4 seen in FIG. 19. Subsequently, an ion implantation is carried out for making regions 31 and 32 high concentration n-type regions. Subsequently, a thick insulating film 40 in FIG. 19 is deposited, and metallic wirings 51, 52 and 53 are provided through contact windows 6 as seen in FIG. 20. Then, the element is completed. In the present example, the ring oscillator as shown in FIG. 10 was constructed by the use of the unitary circuits as illustrated in FIGS. 19 and 20. The use of the SOS material in the present example is effective principally to improve the operating speed of the circuit of this invention. In fact, in the present example, a value of $8 \times 10^{-9} s$ was attained as the delay time per stage of inverter, and the power dissipation at this time was $5 \times 10^{-6} W$. Essentially, the semiconductor circuit of this invention does not operate at a very high speed. One of the reasons therefor is that parasitic capacitances are considerably large due to the circuit structure. As understood from the sectional view of the present embodiment shown in FIG. 19, in the present embodiment, the base being the signal input contacts only at a side wall part with the emitter being an earth terminal or the collector being the signal output, and the base has none of the parts under the emitter and the collector as in the first to fourth embodiments of this invention whose sectional views are given in FIG. 9. This fact serves for the sharp reduction of the parasitic capacitances and the enhancement of the operating speed in the present embodiment. It is also possible to operate the element by applying an input signal to the gate electrode 41.

EXAMPLE 7

Figure 21:
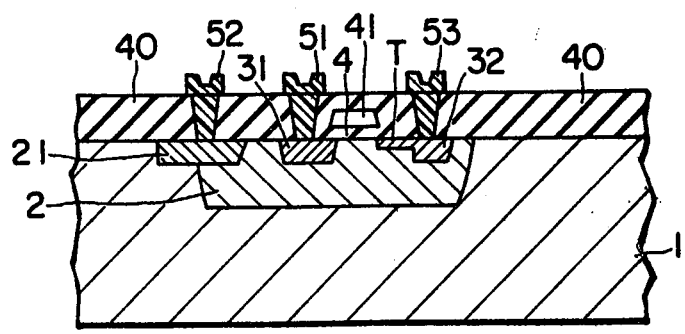

The seventh embodiment of this invention will be described with reference to FIG. 21. The present embodiment in FIG. 21 does not differ from the first to fourth embodiments of this invention explained with reference to FIG. 9, in point of having the n-type substrate 1, the p-type well 2, the p$^+$ region 21, the n$^+$ emitter 31, the n$^+$ collector 32, the thin insulating film 4, the polycrystalline silicon gate 41, the thick insulating film 40, and the metal electrodes 51, 52 and 53. It is characterized in that a thin, comparatively high concentration n-type region T having a thickness of 0.1 μm and a concentration of $1 \times 10^{18}$ cm$^{-3}$ is provided in a region which couples a part directly under the gate electrode 41 and the collector region 32. The provision of such thin n-type region is adopted in order to raise the withstand voltage in an insulated gate field-effect transistor. In this invention, however, to prevent the punch-through between the emitter and the collector and to thereby prevent a current, which cannot be controlled by the potential of the gate or the base, from flowing therebetween is more important than to enhance the withstand voltage which is determined by the avalanche breakdown. In particular, in case where the gate length is made small, it is effective from the above-mentioned viewpoint to provide a shallow n-type region, such as the region T, in contact with the collector region. Also in this case, it is possible to operate the element by applying a signal input to the gate electrode 41.

In the present example, the gate length could be made small down to 1 μm by employing the structure as shown in FIG. 19, and the switching speed could accordingly be raised up to about $3 \times 10^{-8} s$. In the semiconductor circuit of this invention, essentially the emitter and the collector are not distinguished and they are equal. In the present embodiment and the fifth embodiment shown in FIG. 18, the symmetry between the emitter and the collector is lost. The symmetry apparently lost, however, can be recovered in the fifth embodiment in such a way that a p-type region of comparatively high concentration is also diffused from the collector diffusion hole and that it is brought into contact with the p-type region of the same concentration from the emitter diffusion hole, and in the seventh embodiment in such a way that shallow n-type layers T are symmetrically provided on both the sides of the gate 41.

EXAMPLE 8

The eighth embodiment of this invention will be described with reference to a sectional view of FIG. 22, a circuit diagram of FIG. 23 and a plan view of FIG. 24. The embodiment in FIG. 22 comprises an n-type substrate 1, a p-type well 2, a p$^+$ region 21, n$^+$ regions 31, 32 and 33, a thin insulating film 4, gate polycrystalline silicon layers 41 and 42, a thick insulating film 40, and metallic electrodes and wirings 51 and 52. It has structural features in that a plurality of gate electrodes 41 and 42 are provided for the single p-type well and that the n+ electrode 31 extends to outside the p-type well so as to lie in conduction with the n-type substrate 1. The manufacturing process of the present embodiment does not differ from that of the first embodiment explained with reference to the sectional view of FIG. 9. An example of a circuit constructed with the present embodiment is shown by the circuit diagram in FIG. 23 and by layout in FIG. 24. It is a NOR circuit of two inputs of IN1 and IN2. A driver element Q1 is a semiconductor circuit element of this invention in which an emitter is the n-type region 31 in FIG. 22, a collector is the n-type region 32, a gate is the layer 41, and a base is the p-type region 2 having the p+ region as its lead-out portion, and which has an external positive gate power supply $V_{GG1}$ and an input signal source IN1 for forward-biasing the base — emitter circuit, the input signal changing between a positive potential and the zero potential. It will be easily understood by the aid of FIG. 24 that a driver element Q2 is similar to the driver element Q1.

Figure 22:
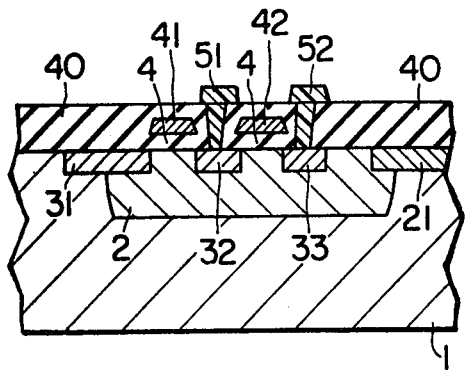
Figure 23:
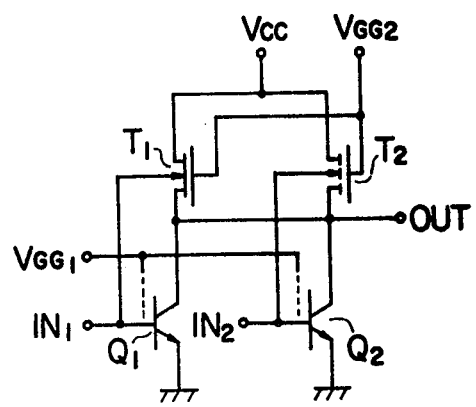

On the other hand, a load element T1 is a field-effect transistor in which, with reference to FIGS. 22 and 23, a source is made of the n+ region 32, a drain is made of the n+ region 33, a substrate is made of the p-type well 2, and a gate is made of the layer 42. A load element T2 is similar. Since the load elements T1 etc. lie in the same p-type wells as for the driver elements Q1 etc., they are also circuit elements of this invention. However, they are intentionally called the field-effect transistors and expressed in FIG. 23 as such. The reason therefor is that the surface of an active portion of the load element, for example, T1 is normally kept in an intense inversion state by a supply voltage $V_{GG2}$, and it is indicated that the load element does not differ from a mere enhancement type MOS load. In this case, it is also possible to operate the device by applying the input signal to the gate 41.

Figure 24:
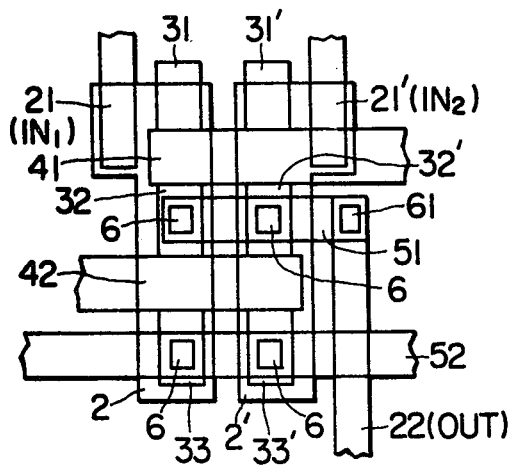

As illustrated in FIG. 24, in the NOR gate of the present embodiment, input and output signals are received and delivered through p+ diffused layers 21, 21' and 22. Therefore, although there are the two systems of gate power supply wirings, interconnections on the chip are not thrown into considerable confusion. In the concepts of the prior-art integrated circuits, it is not considered to feed through the interior of the p+ diffused layer the signals of voltages which are positive with respect to the n-type substrate used as the grounding conductor. Since the gate of the present embodiment operates under a very low supply voltage of only 0.25 V to 0.4 V or so, such interconnections are possible. Needless to say, polycrystalline silicon layers or metallic wirings can also be utilized as the input and output terminals.

EXAMPLE 9

Figure 26:
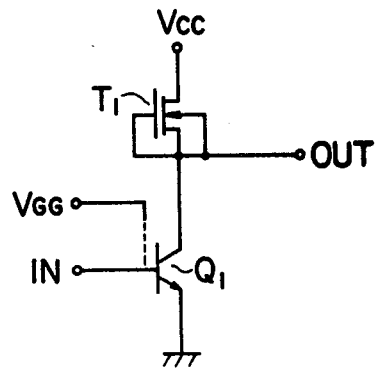
Figure 25:
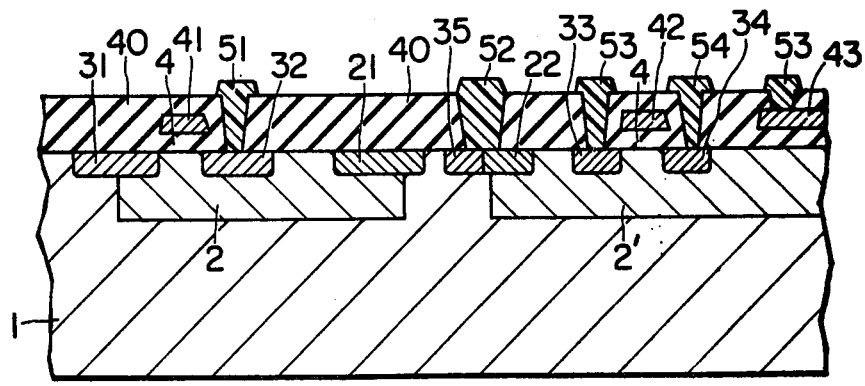
Figure 27:
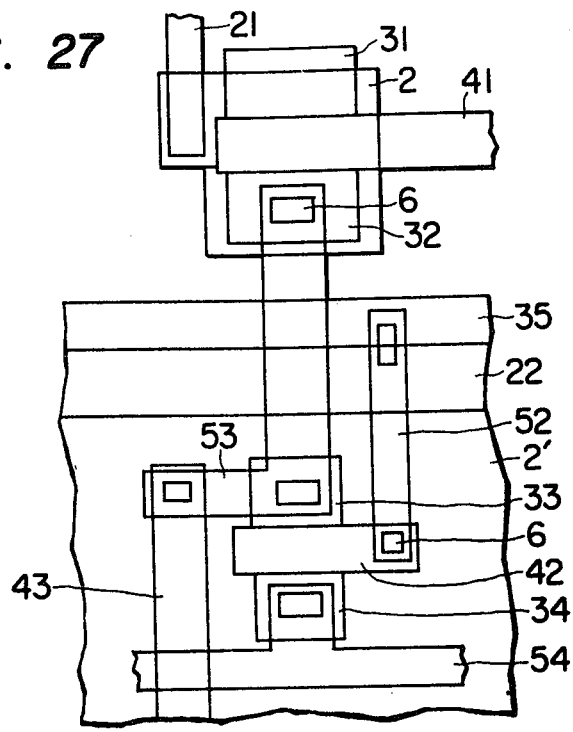

The ninth embodiment of this invention will be described with reference to a sectional view of FIG. 25, a circuit diagram of FIG. 26 and a plan view of FIG. 27. FIG. 25 shows a structure comprising an n-type silicon substrate 1, p-type wells 2 and 2', p+-type regions 21 and 22, n+-type regions 31, 32, 33, 34 and 35, an insulating film 4, a thick insulating film 40, polycrystalline silicon gates 41 and 42, a polycrystalline silicon wiring 43, and metal electrode wirings 51, 52, 53 and 54. The manufacturing process of the embodiment is not greatly different from that explained on the first embodiment. Using the structure, a circuit shown in FIG. 26 was constructed. The functions of the circuit will be explained with reference to the plan view of FIG. 27. The circuit in FIG. 26 is an inverter circuit, in which a driver element Q1 is a constituent of the semiconductor circuit of this invention. It is formed in the p-type well 2; and its input or base to which a forward bias signal with respect to its emitter being the n+ region 31 is applied is the p-type well 2 having the p+ region 21 as a lead-out port therefor, and its collector is the n+ region 32. In addition, in order to make low the resistance during the "on" period of the driver element Q1, the lateral width of the element, i. e., the width of opposing lines of the emitter and the collector as viewed on the plan of FIG. 27 is set to be comparatively large. On the other hand, a load element T1 is a field-effect transistor which is formed in the p-type well 2' different from that for the element Q1. It has the n+ regions 33 and 34 as a source and a drain, respectively, and the gate 42. The collector of the driver element Q1 is connected to the source 33 of the load element T1 by the metallic wiring 51, which is further joined to the metallic wiring 53 and the polycrystalline silicon wiring 43 in order to supply an input for the succeeding stage. The gate of the load element T1 is connected to the p+ region 22. Simultaneously, the p+ region 22 is short-circuited to the n+ region by the wiring 52, so that it is at the earth potential. The drain 34 of the load element T1 is held at a supply voltage of 3 V by the power supply wiring 54.

When an input signal of 0.25 V enters an input terminal IN in FIG. 26, i. e., the p+ region 21 in FIG. 25 or FIG. 27, the driver element Q1 turns "on," and the potential of an output terminal OUT in FIG. 26, i. e., the conductors 53 and 43 in FIG. 25 or FIG. 27 lowers. Herein, the potential can be made approximately zero because the current capacity of the driver element Q1 is set to be large. Conversely, when the potential of the terminal IN is zero, the potential of the terminal OUT gets to about 3 V. In this way, the circuit element Q1 of this invention constructed in one p-type well can supply the output voltage sufficient for driving the conventional N-channel MOS circuit constructed in the other p-type well. Needless to say, the construction itself of the present embodiment can be applied as a mere load MOS element which is constructed in an isolated p-type well separate from a driver element. Also in this case, it is possible to operate the device by applying the input signal to the gate electrode. Just as the present embodiment indicates that the circuit of this invention can coexist with an N-type MOS circuit or P-type MOS circuit on the chip, the first embodiment of this invention which is operated by maintaining the n-type substrate at the supply voltage can naturally coexist with a complementary MOS (CMOS) circuit. It is also possible to make the semiconductor circuit of this invention coexistent with a conventional bipolar integrated circuit. This can be realized by forming the p-type well of the above embodiment at the diffusion of a base and an n+ region at the diffusion of an emitter into an n-type layer which is usually employed as a collector and which is epitaxially formed in many cases.

EXAMPLE 10

Figure 28:
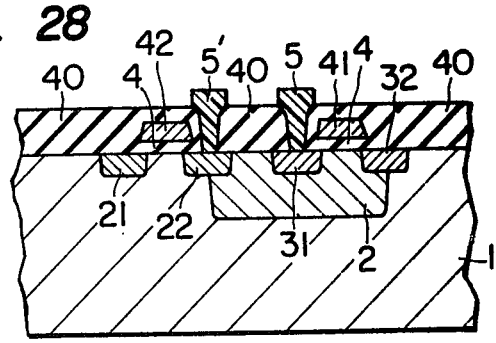

The tenth embodiment of this invention will be described with reference to a sectional view, plan views and circuit diagrams of from FIG. 28 to FIG. 33. A sectional structure in FIG. 28 is the fundamental structure of the present embodiment as comprises an n-type silicon substrate 1, a p-type well 2, high concentration p-type (p+) regions 21 and 22, high concentration n- type (n+) regions 31 and 32, a thin insulating film 4, a thick insulating film 40, polycrystalline silicon gates serving also as wirings 41 and 42, and a metal electrode and wiring 5. While the details of the manufacturing process are not described, the outline is the same as in the first embodiment shown in FIG. 9. The characterizing feature of a circuit arrangement in the present embodiment is that a gate electrode as shown at 42 in FIG. 26 is also provided at the surface of the n-type substrate and that a unitary circuit made up of the gate electrode, the n-type substrate 1 and p+ regions 21 and 22 is employed as the load or current source of a driver circuit provided in the p-type well. More specifically, in a ring oscillator constructed by a multistage connection of inverters as shown in the circuit diagram of FIG. 29, an element Q1, for example, among elements Q1, Q2, . . . and $Q_n$ which are driver elements formed in the p-type wells is a constituent of the semiconductor circuit of this invention in which an emitter is the n+ region 31, a collector is the n+ region 32, a base is the p-type well 2 having the lead-out p+ region 22, and a gate is the polycrystalline silicon layer 41 and which is equipped with means for applying a voltage, being forward with respect to the emitter, to the base 2 as an input. On the other hand, an element T1, for example, among elements T1, T2, . . . and T$n$ which are load elements formed on the n-type substrate is also a constituent of the semiconductor circuit of this invention as understood from the fact that it includes the p+ region 21 as an emitter, the p+ region 22 as a collector, the substrate 1 as a base and the polycrystalline silicon layer 42 as a gate and that it is equipped with means for applying to the base 1 a voltage being negative with respect to the emitter 21, i.e., a forward bias in this case.

Figure 29:
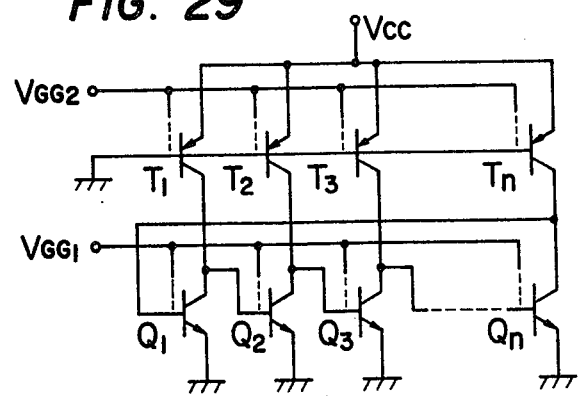
Figure 30:
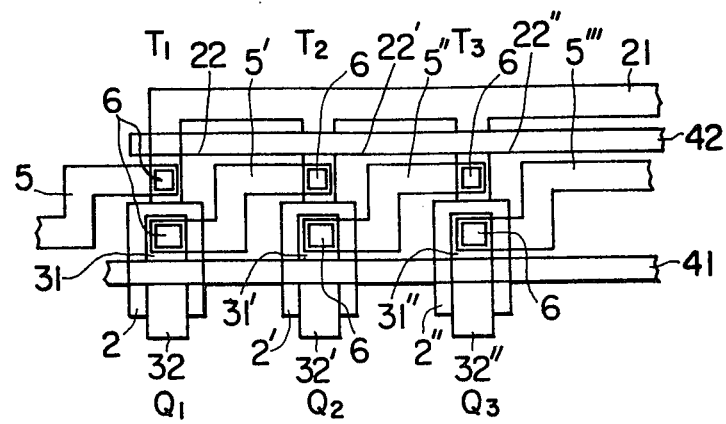

A plan view of the ring oscillator shown in FIG. 29 becomes as shown in FIG. 30. The driver circuits Q2, Q3, . . . are composed of parts indicated by corresponding Nos. in which Nos. denoting the respective parts of the element Q1 stated above have dashes put in succession, and the driver circuits Q1, Q2, Q3 . . . hold the gate 41 in common. The load circuits T2, T3, . . . hold the substrate 1, the gate 42 and the emitter 21 in common with the load circuit T1, and include collectors 22', 22'', . . . . An example of measurement on the ring oscillator will be stated. When it was operated under gate supply voltages $V_{GG1} = 1.0$ V and $V_{GG2} = -0.65$ V and a main supply voltage $V_{CC} = 0.25$ V, the power dissipation per stage of inverter $p_d$ was $4 \times 10^{-7}$ W, the delay time $t_{pd}$ was $2 \times 10^{-8}$ s and the $t_{pd}p_d$ product was $8 \times 10^{-15}$ J.

In the present embodiment, the threshold voltage $V_T$ of the load element is $-1$ V. When the gate supply voltage $V_{GG2}$ is made deeper than $-0.75$ V or has the absolute value made greater in the negative direction, the load element is already in the "on" state as a p-channel insulated gate field-effect transistor. This case may therefore be expressed as the performance of this invention as a PMOS load. Even under this state, the circuit operates satisfactorily and can demonstrate an efficiency equivalent to the above-mentioned result.

The following is added here. In the process of manufacturing the present embodiment, there was also tried a structure in which the gate electrode 42 for the load element was omitted, that is, a structure in which a load was a lateral P-N-P transistor having the p+ region 21 as an emitter, the substrate 1 as a base and the p+ region 22 as a collector. Then, under $V_{GG} = 1.0$ V, $t_{pd} = 3 \times 10^{-8}$ s and $p_d = 10^{-6}$ W were obtained per stage of inverter, but 0.5 V was required as the main supply voltage $V_{CC}$.

Figure 31:
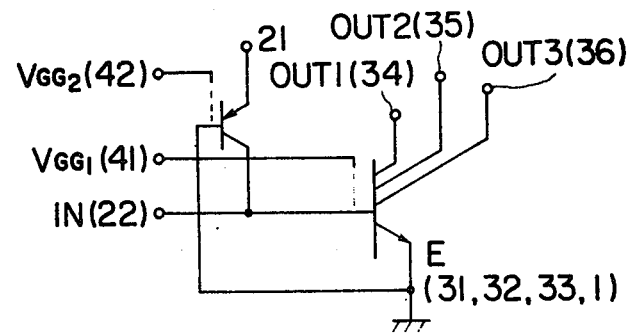
Figure 32:
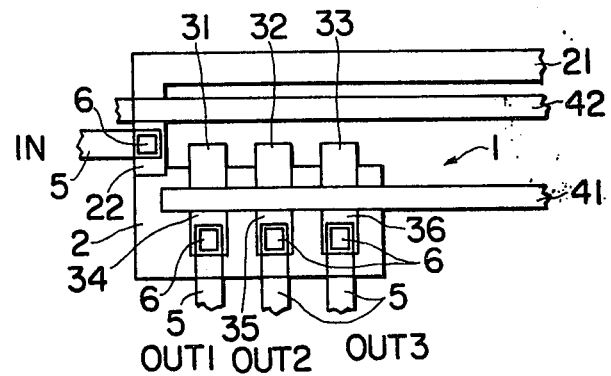

Referring back to the present embodiment which has the load element with the gate, FIGS. 31 and 32 show the circuit diagram and the plan view of the fundamental element for constructing a logical circuit by the use of the circuit of the present embodiment, respectively. The fundamental element in these two figures consists of a current source (load) which comprises a p+ emitter 21, a p+ collector 22, a gate 42 and an n-type base (substrate) 1, and a driver circuit which comprises n+ emitters 31, 32 and 33 (on the common substrate), n+ collectors 34, 35 and 36, a gate 41 and a p-type base 22 (or 2). It includes a single input terminal IN, and a plurality of output terminals OUT1, OUT2 and OUT3. It is quite the same as in case of the integrated injection logic (IIL) circuit that a logical circuit can be constructed of the circuits of the specified type. In fact, the circuit arrangement of the present embodiment does not vary from the IIL circuit at all except that the gate wirings are provided. Differences of the present embodiment from the IIL device are that, since the injection effect intensified by the field effect of the gate is adopted, the embodiment operates at low voltages down to 0.25 V lower than in the IIL device and that, since the minority carrier accumulation which limits the speed of the IIL circuit arises only in an extremely limited region in the vicinity of the base surface, the embodiment is capable of an operation of comparatively high speed in spite of low power.

Figure 33:
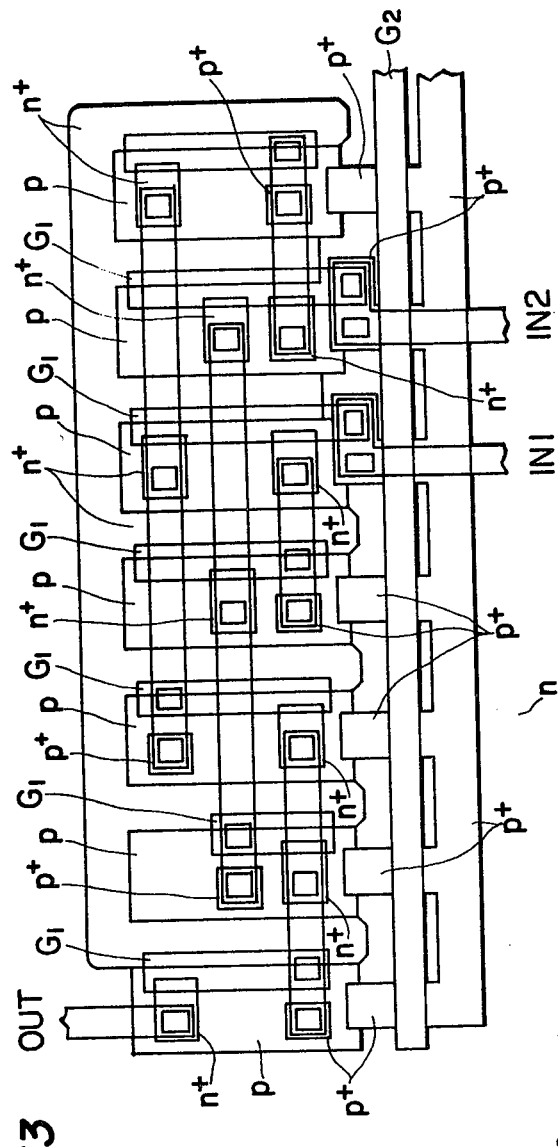

FIG. 33 is a plan view of an EXCLUSIVE OR logic circuit based on a structure in which the present embodiment is somewhat modified. In this figure, p+ and n+ or $p$ and $n$ indicate the conductivity types of respective parts, and G1 and G2 indicate polycrystalline silicon gates. IN1 and IN2 denote input terminals, and OUT denotes an output terminal at which, letting the truth values of IN1 and IN2 be A and B respectively, a truth value $\bar{A}\cdot B + A\cdot\bar{B}$, namely, EXCLUSIVE OR is obtained. The plan structure of this circuit essentially differs from those of the circuits in FIGS. 30 and 32 only in that all the gates G1 of the driver elements are short-circuited to the base, and hence, it is omitted as to this drawing to explain in detail by affixing part Nos. In the present embodiment, the earth wiring resistance can be reduced by employing as a starting material a material in which n-type silicon is epitaxially grown on n+ silicon.

EXAMPLE 11

Figure 34:
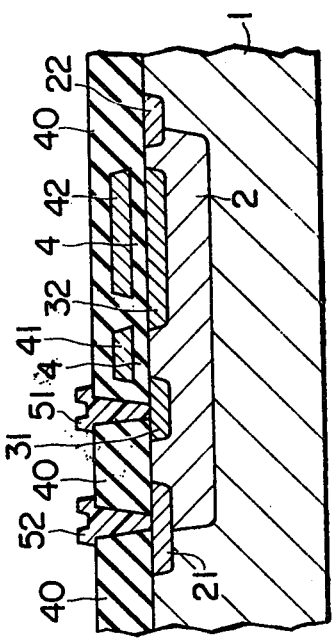

The eleventh embodiment of this invention will be described with reference to a sectional view of FIG. 34 and circuit diagrams of FIGS. 35 and 36. The present embodiment constructs a memory circuit by exploiting the fact that the semiconductor circuit element of this invention essentially has two different input terminals of the gate and the base. The device shown in FIG. 34 comprises an n-type silicon substrate 1, a p-type well 2 acting as a base, p+ base lead-out ports serving also as guard bands 21 and 22, n+-type regions 31 and 32 acting as an emitter and a collector, a thin oxide film 4, a polycrystalline silicon gate 41 acting also as a word line, a grounding electrode 42 of polycrystalline silicon for electrostatic capacitances, a thick oxide film 40, a metallic wiring 51 acting as a bit line, and a base electrode wiring 52. The manufacturing process of the present embodiment does not essentially differ from that of the first embodiment of this invention stated in association with FIG. 9. In the present example, a memory circuit shown in FIG. 35 was constructed by the use of the structure of FIG. 34. In the circuit arrangement of FIG. 35, circuits in which one circuit element explained in conjunction with FIG. 34 is constructed in every well are arrayed in the form of a matrix as $T_{11}, T_{12}, \ldots ; T_{21}, T_{22}, \ldots ; T_{31}, T_{32}, \ldots ; \ldots$ . Capacitances $C_{11}, C_{12}, \ldots ; C_{21}, C_{22}, \ldots ; C_{31}, C_{32}, \ldots ; \ldots$ which store information on the basis of the presence or absence of charges are, when explained in FIG. 34, capacitances between the $n^+$ regions 32 and the polycrystalline silicon earth electrodes 42.

Figure 35:
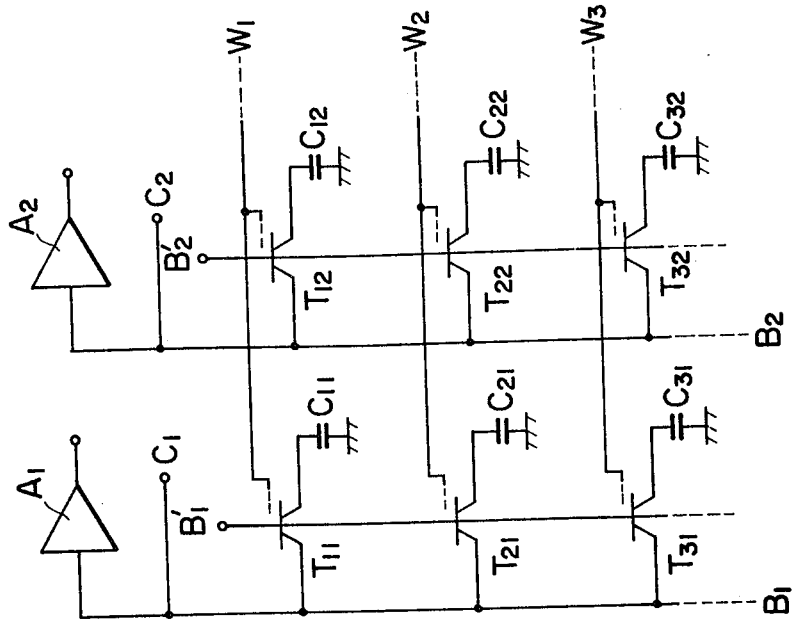

Since a plan view of the matrix in FIG. 35 can be easily imagined from the figure and FIG. 34, it is omitted from the illustration. In FIG. 35, C1, C2, . . . designate terminals which control writing and refresh for compensating for loss attributed to a leakage current of the storage charges, and A1, A2, . . . indicate amplifiers which serve to execute the refresh and the detection of charges. B1, B2, . . . represent metallic wirings for joining the $n^+$ regions and they are called bit lines, and W1, W2, . . . denote wirings made of the extensions of the polycrystalline silicon gates and they are called word lines. In this case, the substrate 1 is biased at a positive fixed potential. W'1, W'2, . . . designate auxiliary word lines which join the base electrodes. Except that the auxiliary word lines W'1, W'2, . . . are included, the circuit of FIG. 35 does not vary from the so-called 1 MOS memory. Since, however, it includes two systems of word lines, it can conduct the writing and the reading or refresh with the separate systems of word lines. For example, for the writing, while holding the potential of the auxiliary word lines W'1, W'2, . . . at zero, the potential of the word line $W_n$ is made sufficiently higher than the threshold voltage, and the potential of the bit line $B_m$ is raised or lowered, whereby the predetermined capacitance $C_{mn}$ is charged or discharged. At this time, the unitary circuit $T_{mn}$ is used as a field-effect transistor. Subsequently, when the information of the particular bit is to be read out, the potential of the auxiliary word line $W'_n$ may be made about 0.3 V and the detection amplifier $A_m$ may be rendered operative. At this time, the unitary circuit $T_{mn}$ functions as the circuit element of this invention, and it exhibits a great current amplification factor. Accordingly, effective read-out at low signal levels is possible. Moreover, there are such advantages that an operation in which during the writing of a predetermined address of a certain column in FIG. 35, an address of another column is read out is easily carried out. A 256-bit RAM (random access memory) was constructed with the arrangement of FIG. 35, and a refresh time of 2 seconds and an average access time of 200 ns were obtained. In this case, even when the auxiliary word lines W'1, W'2, . . . are directly coupled with the word lines W1, W2, . . . , respectively, the function as the memory does not change.

Figure 36:
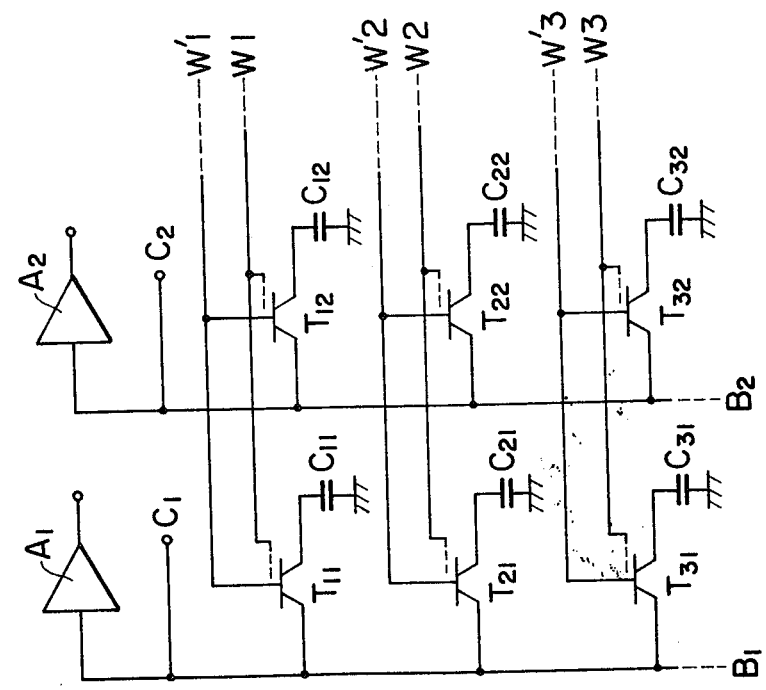

FIG. 36 shows a modification of the present embodiment. In this figure, all the unitary circuits $T_{11}, T_{21}, T_{31}, \ldots$ in one column are formed in an identical p-type well. The same applies to the other columns. It is as in the ordinary 1 MOS memory that the writing can be done by selecting the combination between any of the word lines W1, W2, . . . and any of the bit lines B1, B2, . . . likewise to the case of FIG. 35 and that the reading can be done every bit by the converse process. Different is that, since all the memory cells in the column lie in the identical p-type well, the modified embodiment has a special function in which by biasing, e. g., the auxiliary bit line B'1 to about 0.3 V, the summation of charges having been held in the capacitances of the memory cells $T_{11}, T_{21}, T_{31} \ldots$ can be detected by the detection amplifier A1. This function is applicable to a D/A converter, etc. At this time, by utilizing a phase delay caused in the bit line B1, charges accumulated in the capacitances $C_{11}, C_{21}, C_{31}, \ldots$ can be read out in time series without clock by the detection amplifier. This operation is very effective for such processing as wholly transferring the stored contents of a RAM to another device.

EXAMPLE 12

Figure 37A:
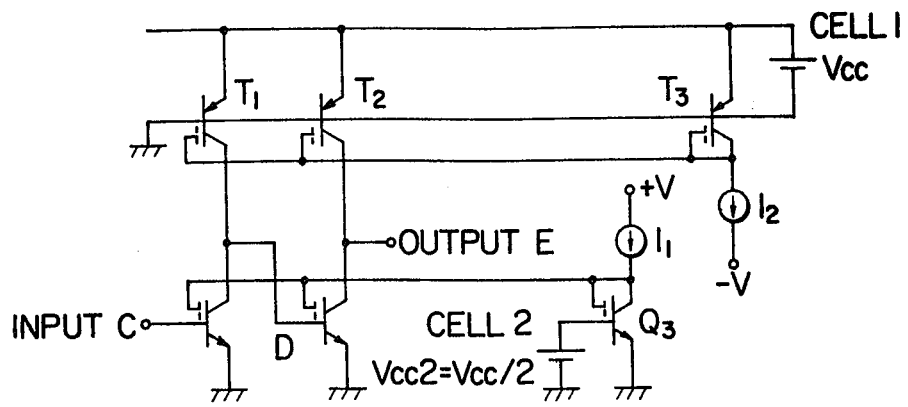
Figure 37B:
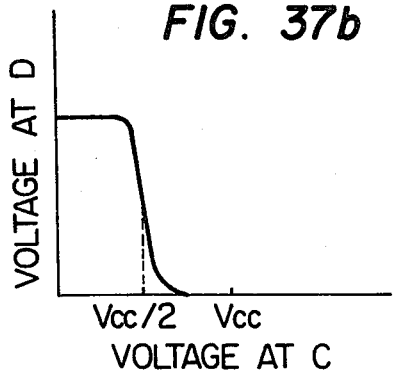

FIGS. 37a and 37b show the twelfth embodiment of this invention. It compensates for a dispersion in the gate threshold voltage $V_T$ and temperature changes, and causes the circuit of this invention to operate stably. Here, $T_1 - T_3$ and $Q_1 - Q_3$ designate transistors integrated on an identical chip, and they have the same structure as in FIG. 29. The transistor $T_3$ supplies a bias voltage of the transistors $T_1$ and $T_2$, and the transistor $Q_3$ supplies a bias voltage of the transistors $Q_1$ and $Q_2$. $I_1$ and $I_2$ designate constant current sources within or outside the chip. $V_{CC}$ indicates a battery for feeding a supply voltage. $V_{CC2}$ denotes a voltage which determines the transition point between the high level and the low level of an input — output transfer characteristic, and by way of example, $V_{CC2} = V_{CC}/2$. Thus, at a point A, a gate voltage which causes a current $I_1$ to flow through the transistor $Q_3$ is generated when the voltage of $V_{CC}/2$ is applied to the base of the transistor $Q_3$. Similarly, at a point B, a voltage which causes a current $I_2$ to flow through the transistor $T_3$ is generated. Assuming here that $I_1 = I_2$, when a voltage which is slightly higher than $V_{CC}/2$ is applied to an input C, a point D becomes the low level and an output E becomes the high level. Conversely, when a voltage which is slightly lower than $V_{CC}/2$ is applied to the input C, the point D becomes the high level and the output E becomes the low level. It is therefore possible to realize the input — output transfer characteristic per stage as illustrated in FIG. 37b. If only the gate threshold voltages $V_T$ within the chip are equal, the input — output transfer characteristics are constant independently of the absolute value of $V_T$. Therefore, by forming at least the transistors $T_1 - T_3$ and $Q_1 - Q_3$ in the present circuit on the identical chip, an operation stable against the dispersion of $V_T$ and temperature changes becomes possible. Although the simple inverter of two-stage cascade connection is exemplified in FIG. 37a, it is to be understood from the principle that the circuit to be compensated may be any circuit such as a complicated logical circuit memory.

Figure 38:
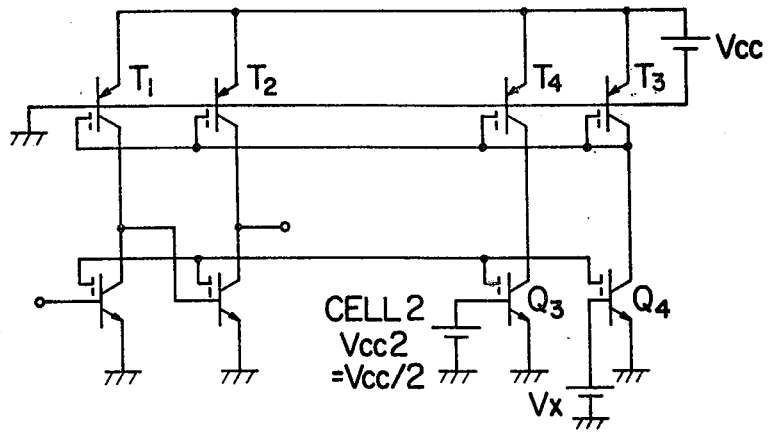

In case where, in FIG. 37a, the gate threshold voltage $|V_T|$ of the P-channel or N-channel FET is lower than $V_{CC}$, the transistors of the structure of this invention can be substituted for the constant current sources as in FIG. 38. Here, a transistor $T_4$ in FIG. 38 is substituted for the constant current source $I_1$ in FIG. 37a, and a transistor $Q_4$ for the constant current source $I_2$. $V_X$ designates a battery for controlling a current which flows through the transistors $Q_4$. The operations of the other parts are quite the same as in FIG. 37a.

As set forth above, according to this invention, one is enabled to construct a variety of useful integrated circuits for logic, memory etc. which are capable of a low voltage operation having hitherto been impossible and which are low in the power dissipation and high in the packaging density.

What is claimed is:

1. An electron device comprising
   (i) a semiconductor element which includes a semiconductor region A of a first conductivity type, a semiconductor region B of a second conductivity type adjoining said region A, and a semiconductor region C of said second conductivity type adjoining said region A and isolated from said region B by said region A, said regions A, B, and C being made by single crystal silicon, and in which on a surface extending from said region B via said region A to said region C, a gate electrode is provided through an insulating film,
   (ii) means for applying a forward bias voltage of at most 0.6V between said region A and said region B,
   (iii) means for applying a voltage between said region C and said region B by which a potential relative to the minority carriers existing in said region A becomes lower in said region C than in said region B, and
   (iv) means for applying to said gate electrode a potential by which a surface portion of said region A directly under said gate electrode is made a weak-inversion region.

2. The electron device according to claim 1, wherein said region A is made of a semiconductor substrate of said first conductivity type, and said regions B and C are formed in surface portions of said semiconductor substrate.

3. The electron device according to claim 1, wherein said region A is a region of said first conductivity type which is formed in the shape of a well from a surface of a semiconductor substrate of said second conductivity type, and said regions B and C are constructed so that at least a part of each of these regions may exist in a surface portion of the well-shaped region A.

4. The electron device according to claim 3, wherein a high concentration region of said first conductivity type is provided, at least a part thereof existing in a surface portion of said region A.

5. The electron device according to claim 1, wherein said gate electrode is connected with said region B.

6. The electron device according to claim 1, wherein said gate electrode is connected with said region A.

7. The electron device according to claim 1, wherein said gate electrode is connected with said region C.

8. The electron device according to claim 1, wherein said gate electrode is connected with a power supply terminal.

9. The electron device according to claim 1, wherein said gate electrode is made of polycrystalline silicon.

10. The electron device according to claim 1, wherein a plurality of such semiconductor elements are integrated.

11. The electron device according to claim 3, wherein a high concentration region of said second conductivity type is provided in a surface portion of said semiconductor substrate as lies between the regions A.

12. The electron device according to claim 3, wherein a high concentration region of said first conductivity type is provided in a surface portion of said semiconductor substrate as lies around said region A.

13. The electron device according to claim 1, wherein said regions A, B and C are formed on a sapphire substrate.

14. The electron device according to claim 3, wherein a conductive electrode is provided through an insulating film on a surface of said region C.

15. A semiconductor device comprising:
    a semiconductor body having a first surface and including
    a first semiconductor region of a first conductivity type disposed in a first portion of said body and extending to said first surface; and
    second and third semiconductor regions of a second conductivity type, opposite said first conductivity type, disposed in second and third respective portions of said body separated from one another by said first portion of said body, said second and third regions defining respective first and second PN junctions with said first semiconductor region;
    a layer of insulating material disposed on said first surface of said body so as to overlie said first portion of said body and the terminations of said first and second PN junctions at said first surface;
    an electrode disposed on said layer of insulating material so as to overlie said first portion of said body therebeneath,
    first means for applying a first prescribed voltage as a forward bias voltage between said first and second regions for causing minority carriers relative to said first semiconductor region to be injected from said second semiconductor region into said first semiconductor region;
    second means for imparting a second prescribed voltage between said second and third semiconductor regions for causing the potential in said third semiconductor region relative to said minority carriers to be lower than the potential in said second region; and
    third means for applying a third prescribed voltage to said electrode to establish a weak-inversion region in the surface of said first portion of said body directly beneath said electrode.

16. A semiconductor device according to claim 15, wherein the absolute value of said first prescribed voltage is at most 0.6 volts.

* * * * *